(12) United States Patent
Yoo et al.

(10) Patent No.: US 11,721,742 B2
(45) Date of Patent: Aug. 8, 2023

(54) MEMORY MODULES AND MEMORY PACKAGES INCLUDING GRAPHENE LAYERS FOR THERMAL MANAGEMENT

(71) Applicant: Micron Technology, Inc., Boise, ID (US)

(72) Inventors: Chan H. Yoo, Boise, ID (US); George E. Pax, Boise, ID (US); Yogesh Sharma, Boise, ID (US); Gregory A. King, Hastings, MN (US); Thomas H. Kinsley, Boise, ID (US); Randon K. Richards, Kuna, ID (US)

(73) Assignee: Micron Technology, Inc., Boise, ID (US)

( * ) Notice: Subject to any disclaimer, the term of this patent is extended or adjusted under 35 U.S.C. 154(b) by 3 days.

(21) Appl. No.: 17/391,920

(22) Filed: Aug. 2, 2021

(65) Prior Publication Data

US 2021/0367057 A1 Nov. 25, 2021

Related U.S. Application Data

(63) Continuation of application No. 16/530,757, filed on Aug. 2, 2019, now Pat. No. 11,081,565.

(51) Int. Cl.
*H05K 1/18* (2006.01)
*H01L 29/66* (2006.01)
*H01L 23/495* (2006.01)
*H05K 1/11* (2006.01)
*H01L 23/14* (2006.01)

(52) U.S. Cl.
CPC ...... *H01L 29/66015* (2013.01); *H01L 23/145* (2013.01); *H01L 23/49506* (2013.01); *H01L 23/49513* (2013.01); *H05K 1/117* (2013.01); *H05K 1/181* (2013.01)

(58) Field of Classification Search
CPC ...... H05K 1/0306; H05K 1/181; H05K 12/72; H05K 12/721; H05K 1/117
See application file for complete search history.

(56) References Cited

U.S. PATENT DOCUMENTS

| 2014/0361428 | A1* | 12/2014 | Park | H01L 25/50 257/737 |
|---|---|---|---|---|
| 2015/0008588 | A1 | 1/2015 | Kim et al. | |
| 2021/0036125 | A1 | 2/2021 | Yoo et al. | |

* cited by examiner

*Primary Examiner* — Jeremy C Norris
(74) *Attorney, Agent, or Firm* — Perkins Coie LLP

(57) ABSTRACT

Systems, apparatuses, and methods relating to memory devices and packaging are described. A device, such as a dual inline memory module (DIMM) or other electronic device package, may include a substrate with a layer of graphene configured to conduct thermal energy (e.g., heat) away from components mounted or affixed to the substrate. In some examples, a DIMM includes an uppermost or top layer of graphene that is exposed to the air and configured to allow connection of memory devices (e.g., DRAMs) to be soldered to the conducting pads of the substrate. The graphene may be in contact with parts of the memory device other than the electrical connections with the conducting pads and may thus be configured as a heat sink for the device. Other thin, conductive layers of may be used in addition to or as an alternative to graphene. Graphene may be complementary to other heat sink mechanisms.

19 Claims, 3 Drawing Sheets

MEMORY MODULES AND MEMORY PACKAGES INCLUDING GRAPHENE LAYERS FOR THERMAL MANAGEMENT

CROSS-REFERENCE TO RELATED APPLICATION(S)

This application is a continuation of U.S. application Ser. No. 16/530,757, filed Aug. 2, 2019, which is incorporated herein by reference in its entirety.

TECHNICAL FIELD

The present disclosure generally relates to memory modules and memory packages, and more particularly relates to memory modules and memory packages including graphene layers for thermal management.

BACKGROUND

Semiconductor memories are often provided in memory modules or memory packages for use in system applications. As memory devices are provided with greater capacities and faster performance, the amount of heat generated poses a challenge to memory module and package design. There exists a need to convey heat away from the memory devices to heat radiating structures which can be cooled by, e.g., forced air cooling.

DETAILED DESCRIPTION

As discussed above, thermal management of memory packages and modules poses a number of challenges, particularly given the amount of heat generated by higher-capacity and higher-bandwidth memory devices. For example, a memory module (e.g., a DDR4 DIMM) can include a printed circuit board (PCB) having an edge connector, a plurality of memory devices (e.g., DRAM devices), and a registering clock driver (RCD). To convey thermal energy away from the memory devices and RCD during operation, conventional approaches have employed thermally conducting structures attached to the memory devices and/or RCD (e.g., heat sinks). Heat sinks may comprise a metal or other thermally conductive structure configured to increase the surface area available to radiate heat/permit heat exchange with a cooling gas (e.g., over a surface area greater than that of the outer surfaces of the memory devices and other heat-generating components).

The foregoing approach to thermal management suffers from several drawbacks that limit its performance and applicability. Thermal radiating structures can be costly, consume excessive space (e.g., reducing airflow between adjacent memory modules), and tend only to provide a direct thermal connection to the "back" side of the heat-generating components (i.e., the active circuitry of the memory devices and RCD are usually on the same side as their electrical contacts, such that the side of the heat-generating devices facing the PCB is the side where heat is generated).

Several embodiments of present technology can provide improved thermal management of memory modules and memory packages by providing a graphene heat-transport layer between a heat-generating semiconductor device (e.g., a memory device, an RCD, a controller, etc.) and the substrate or PCB to which it is attached. For example, some embodiments of the present technology are directed to a memory module comprising: a substrate having a plurality of substrate pads; and a memory die disposed over the substrate and having a plurality of electrical connections. Each of the plurality of electrical connections is in contact with a corresponding one of the plurality of substrate pads. The substrate has an uppermost layer of graphene, and the uppermost layer of graphene includes a plurality of openings corresponding to and exposing the plurality of substrate pads.

Figure 1A:
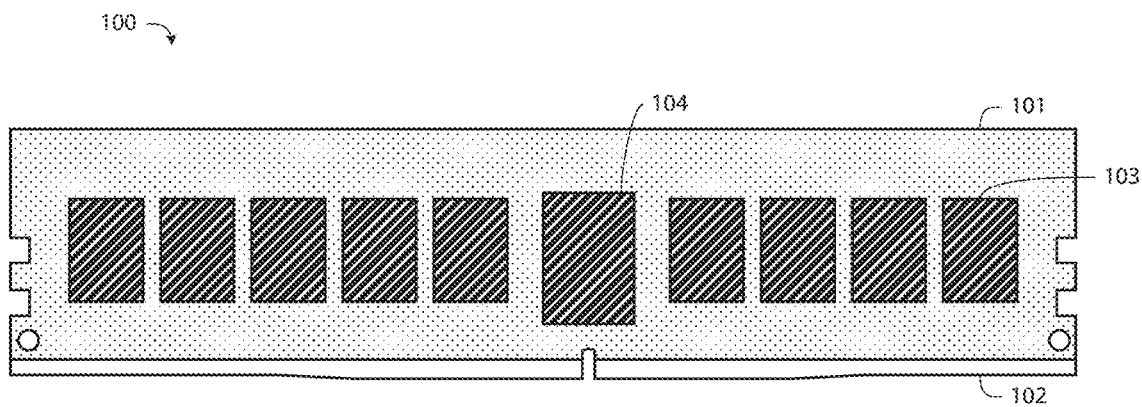
FIGS. 1A and 1B are simplified side and cross-sectional views of a memory module with a graphene layer for thermal management in accordance with an embodiment of the present technology.
Figure 1B:
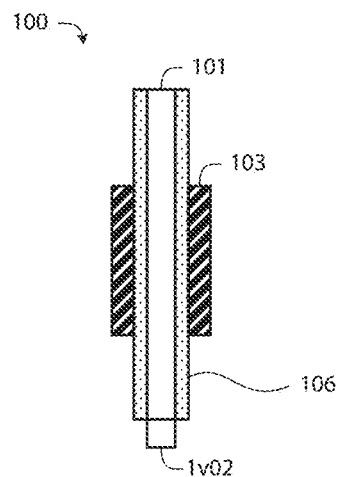

FIGS. 1A and 1B are simplified side and cross-sectional views of a memory module with a graphene layer for thermal management in accordance with an embodiment of the present technology. As can be seen with reference to FIG. 1A, the memory module 100 includes a printed circuit board (PCB) 101 having an edge connector 102, a plurality of memory devices 103 (e.g., DRAM devices), and a registering clock driver (RCD) 104. To convey thermal energy away from the memory devices 103 and RCD 104 during operation, a graphene layer (shown in stippled shading) is provided as an uppermost layer of the substrate 101, underneath and in contact with the memory devices 103 and RCD 104. This arrangement may be more easily understood with reference to the cross-sectional view of memory module 100 set forth in FIG. 1B, in which a graphene layer 106 is illustrated as an uppermost layer of the substrate 101 and extending between the substrate 101 and a memory device 103. As can be further seen with reference to FIG. 1B, memory module 100 is illustrated as a DIMM with memory devices 103 on both sides thereof. Accordingly, graphene layers 106 may be provided on both sides of the module 101, to provide thermal management for semiconductor dies on both sides thereof.

Because the graphene layer 106 extends between the memory devices 103 and the substrate 101, the graphene layer can be placed in contact with the front side of the memory devices 103 (and other semiconductor dies). As the front side of the dies is generally where the most heat is generated, this provides improved efficiency of heat conduction. Graphene has a very high thermal conductivity, even if provided in a very thin layer. For example, a single monolayer of graphene may permit the transport of 300-1500 W/mK. In some embodiments of the present technology, the graphene layer 106 can accordingly be as thin as a single monolayer (e.g., about 25 µm thick). In other embodiments, the graphene layer 106 can include more than one monolayer, and in some embodiments extend up to 1000 µm thick.

Figure 2:
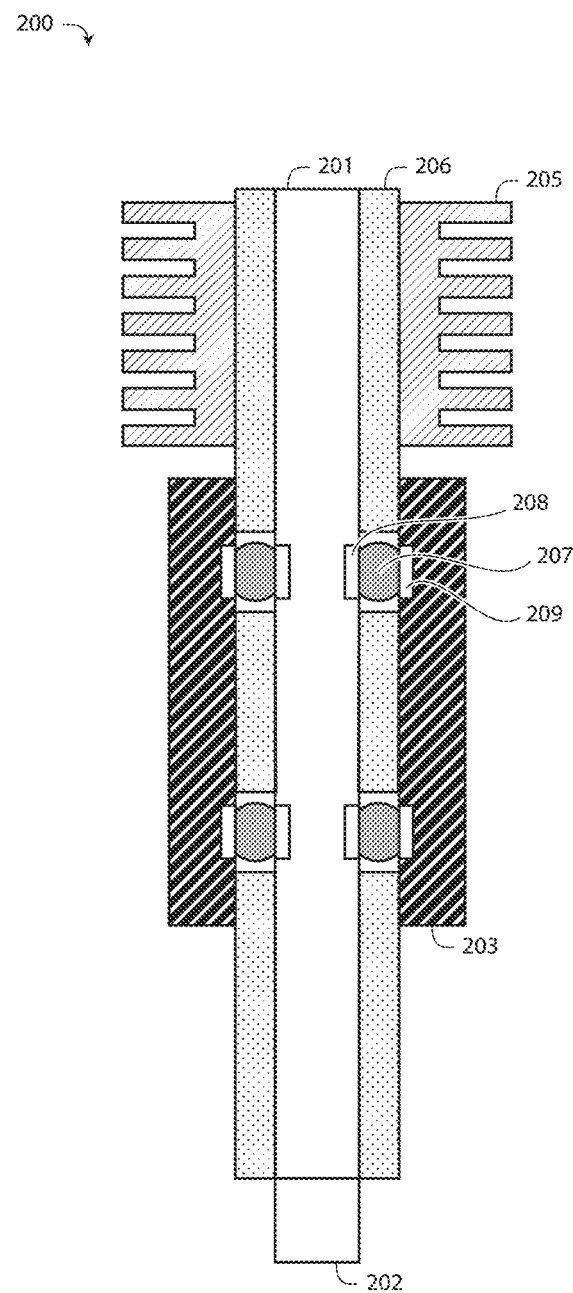
FIG. 2 is a more detailed cross-sectional view of a memory module with a graphene layer for thermal management in accordance with an embodiment of the present technology.

Because graphene is also highly electrically conductive, in accordance with one aspect of the present technology, electrical isolation of the graphene layer from the circuit elements of the memory module is provided. In this regard, FIG. 2 is a more detailed cross-sectional view of a memory module 200 in accordance with an embodiment of the present technology detail. As can be seen with reference to FIG. 2, the graphene layer 206 of memory module 200 includes a plurality of openings aligned with and exposing a corresponding plurality of electrical pads (e.g., substrate pads) 208 in the PCB 201. The electrical pads 208 provide an electrical connection to corresponding electrical contacts 209 on the memory die 203 via solder joints 207, and through traces and vias can provide a connection to the edge connector 202 of the module 200. The openings in the graphene layer 206 provide electrical isolation from the pads, contacts, and solder joints (e.g., by being set back from these circuit elements by a sufficient distance to prevent inadvertent electrical contact). The openings in the graphene layer 206 may further include a dielectric liner or other insulator between the graphene and the circuit elements (not shown).

In accordance with one aspect of the present technology, the graphene layer 206 may be applied to the PCB 201 in any one of a variety of ways known to those of skill in the art. For example, physical vapor deposition (PVC), chemical vapor deposition (CVD), lamination of a previously-grown graphene film, etc. In one embodiment of the present technology, the graphene layer 206 may be applied prior to the formation of the substrate pads 208, and may accordingly exploit the same masking and etching or drilling operations used to form the pads.

The memory module 200 may further include thermal structures 205 configured to radiate or otherwise export (e.g., by heat exchange with a cooling gas) heat generated by the semiconductor components of the memory module 200. Unlike the heat sinks 105 illustrated in the memory module 100 of FIGS. 1A and 1B, the thermal structure 205 of the memory module 200 are disposed over the graphene layer 206, and accordingly are laterally offset from the memory devices 203. This arrangement permits the use of a thermal structure 205 which might otherwise be too large for use in a system where space is limited.

Figure 3:
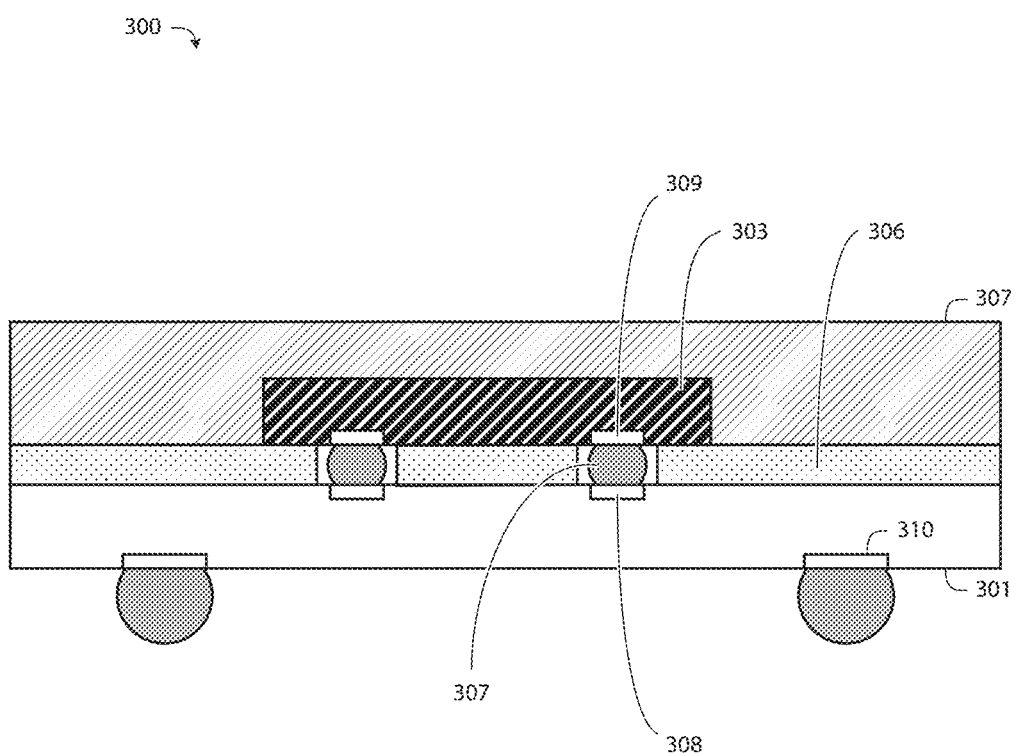
FIG. 3 is a simplified cross-sectional view of a semiconductor device package with a graphene layer for thermal management in accordance with an embodiment of the present technology.

Although in the foregoing example embodiments, memory modules have been illustrated and described with reference to dual in-line memory modules (DIMMs) with DRAM memory devices, various other embodiments of the present technology have application to other semiconductor device packages with different formats and involving different semiconductor devices. For example, FIG. 3 is a simplified cross-sectional view of a semiconductor device package with a graphene layer for thermal management in accordance with an embodiment of the present technology. The semiconductor device package 300 includes a substrate 301 and at least one semiconductor device 303 (e.g., a memory device, a controller, a processor, or any other integrated circuit device). To convey thermal energy away from the semiconductor device 303 during operation, a graphene layer 306 is provided between substrate 301 and semiconductor device 303, underneath and in contact with the semiconductor device 303.

The graphene layer 306 of semiconductor device package 300 includes a plurality of openings aligned with and exposing a corresponding plurality of electrical pads (e.g., substrate pads) 308 in the substrate 301. The electrical pads 308 provide an electrical connection to corresponding electrical contacts 309 on the semiconductor device 303 via interconnects 307 (e.g., solder joints), and through traces and vias can provide a connection to the package contacts 310 of the package 300. The openings in the graphene layer 306 provide electrical isolation from the pads, contacts, and solder joints (e.g., by being set back from these circuit elements by a sufficient distance to prevent inadvertent electrical contact). The openings in the graphene layer 306 may further include a dielectric liner or other insulator between the graphene and the circuit elements (not shown).

In operation of the package 300, the graphene layer 306 is configured to convey thermal energy away from the semiconductor device 303 to a thermal structure 305 (e.g., a package lid). The thermal structure 305 may comprise a metal or other thermally conductive structure configured to increase the surface area available to radiate heat/permit heat exchange with a cooling gas (e.g., over a surface area greater than that of the outer surfaces of the semiconductor device 303.

It should be noted that the methods described above describe possible implementations, and that the operations and the steps may be rearranged or otherwise modified and that other implementations are possible. Furthermore, embodiments from two or more of the methods may be combined.

Specific details of several embodiments of semiconductor devices are described herein. The term "semiconductor device" generally refers to a solid-state device that includes a semiconductor material. A semiconductor device can include, for example, a semiconductor substrate, wafer, or die that is singulated from a wafer or substrate. Throughout the disclosure, semiconductor devices are generally described in the context of semiconductor dies; however, semiconductor devices are not limited to semiconductor dies.

The term "semiconductor device package" can refer to an arrangement with one or more semiconductor devices incorporated into a common package. A semiconductor package can include a housing or casing that partially or completely encapsulates at least one semiconductor device. A semiconductor device package can also include an interposer substrate that carries one or more semiconductor devices and is attached to or otherwise incorporated into the casing. The term "semiconductor device assembly" can refer to an assembly of one or more semiconductor devices, semiconductor device packages, and/or substrates (e.g., interposer, support, or other suitable substrates). The semiconductor device assembly can be manufactured, for example, in discrete package form, strip or matrix form, and/or wafer panel form. As used herein, the terms "vertical," "lateral," "upper," and "lower" can refer to relative directions or positions of features in the semiconductor device or device assembly in view of the orientation shown in the Figures. For example, "upper" or "uppermost" can refer to a feature positioned closer to or closest to, respectively, the top of a page than another feature or portion of the same feature. These terms, however, should be construed broadly to include semiconductor devices having other orientations, such as inverted or inclined orientations where top/bottom, over/under, above/below, up/down, and left/right can be interchanged depending on the orientation.

The devices discussed herein, including a memory device, may be formed on a semiconductor substrate or die, such as silicon, germanium, silicon-germanium alloy, gallium arsenide, gallium nitride, etc. In some cases, the substrate is a semiconductor wafer. In other cases, the substrate may be a silicon-on-insulator (SOI) substrate, such as silicon- on-glass (SOG) or silicon-on-sapphire (SOP), or epitaxial layers of semiconductor materials on another substrate. The conductivity of the substrate, or sub-regions of the substrate, may be controlled through doping using various chemical species including, but not limited to, phosphorous, boron, or arsenic. Doping may be performed during the initial formation or growth of the substrate, by ion-implantation, or by any other doping means.

The functions described herein may be implemented in hardware, software executed by a processor, firmware, or any combination thereof. Other examples and implementations are within the scope of the disclosure and appended claims. Features implementing functions may also be physically located at various positions, including being distributed such that portions of functions are implemented at different physical locations.

As used herein, including in the claims, "or" as used in a list of items (for example, a list of items prefaced by a phrase such as "at least one of" or "one or more of") indicates an inclusive list such that, for example, a list of at least one of A, B, or C means A or B or C or AB or AC or BC or ABC (i.e., A and B and C). Also, as used herein, the phrase "based on" shall not be construed as a reference to a closed set of conditions. For example, an exemplary step that is described as "based on condition A" may be based on both a condition A and a condition B without departing from the scope of the present disclosure. In other words, as used herein, the phrase "based on" shall be construed in the same manner as the phrase "based at least in part on."

From the foregoing, it will be appreciated that specific embodiments of the invention have been described herein for purposes of illustration, but that various modifications may be made without deviating from the scope of the invention. Rather, in the foregoing description, numerous specific details are discussed to provide a thorough and enabling description for embodiments of the present technology. One skilled in the relevant art, however, will recognize that the disclosure can be practiced without one or more of the specific details. In other instances, well-known structures or operations often associated with memory systems and devices are not shown, or are not described in detail, to avoid obscuring other aspects of the technology. In general, it should be understood that various other devices, systems, and methods in addition to those specific embodiments disclosed herein may be within the scope of the present technology.

What is claimed is:

1. An apparatus, comprising:
    a substrate having a layer of graphene that comprises a plurality of openings corresponding to a plurality of substrate pads; and
    a die disposed over the substrate and having a plurality of electrical connections, each of the plurality of electrical connections in contact with a corresponding one of the plurality of substrate pads,
    wherein the layer of graphene is in contact with the die.
2. The apparatus of claim 1, wherein the layer of graphene is configured to convey thermal energy away from the die.
3. The apparatus of claim 1, wherein the layer of graphene is electrically insulated from the plurality of electrical connections.
4. The apparatus of claim 1, wherein the substrate is a printed circuit board.
5. The apparatus of claim 1, wherein the layer of graphene comprises a plurality of monolayers of graphene.
6. The apparatus of claim 1, wherein the plurality of electrical connections comprises a plurality of solder joints.
7. The apparatus of claim 1, wherein the plurality of substrate pads is a first plurality of substrate pads, wherein the die is a first die, wherein the plurality of electrical connections is a first plurality of electrical connections, and wherein the plurality of openings is a first plurality of openings, further comprising:
    a second die disposed over the substrate and having a second plurality of electrical connections, each of the second plurality of electrical connections in contact with a corresponding one of the second plurality of substrate pads,
    wherein the layer of graphene comprises a second plurality of openings corresponding to the second plurality of substrate pads.
8. The apparatus of claim 1, wherein the apparatus is a dual in-line memory module (DIMM) and wherein the die is a DRAM device.
9. An apparatus, comprising:
    a printed circuit board (PCB) that comprises a layer of graphene, an edge connector and a plurality of electrical pads operably coupled to the edge connector; and
    a plurality of semiconductor devices, each of the semiconductor devices comprising a plurality of electrical contacts, each of the electrical contacts operably coupled to a corresponding one of the plurality of electrical pads,
    wherein the layer of graphene is configured to convey thermal energy away from the semiconductor devices, the layer of graphene including a plurality of openings corresponding to the plurality of electrical pads of each of the plurality of semiconductor devices.
10. The apparatus of claim 9, wherein:
    the plurality of electrical pads is a first plurality of electrical pads on a first side of the PCB,
    the plurality of semiconductor devices is a first plurality of semiconductor devices, the layer of graphene is a first layer of graphene, and
    the printed circuit board includes on a second side of the PCB opposite the first side, a second layer of graphene and a second plurality of electrical pads operably coupled to the edge connector,
    the apparatus further comprising a second plurality of semiconductor devices, each of the second plurality of semiconductor devices comprising a plurality of electrical contacts, each of the electrical contacts operably connected to a corresponding one of the second plurality of electrical pads,
    wherein the second layer of graphene is configured to convey thermal energy away from the second plurality of semiconductor devices, the second layer of graphene including a plurality of openings corresponding to and exposing the second plurality of electrical pads.
11. The apparatus of claim 9, wherein the layer of graphene is electrically insulated from the plurality of electrical pads and the plurality of electrical contacts of the plurality of semiconductor devices.
12. The apparatus of claim 9, wherein the layer of graphene comprises a plurality of monolayers of graphene.
13. The apparatus of claim 9, wherein the plurality of electrical contacts of the plurality of semiconductor devices is operably connected to a corresponding one of the plurality of electrical pads by a solder joint.
14. The apparatus of claim 9, wherein the layer of graphene is an outermost layer of the printed circuit board.
15. A semiconductor device package, comprising:
    a substrate including a plurality of substrate pads;
    a semiconductor die including a plurality of electrical contacts, each one of the plurality of electrical contacts operably coupled to a corresponding one of the plurality of substrate pads; and
    a layer of graphene between the substrate and the semiconductor die, the layer of graphene including a plurality of openings corresponding to the plurality of substrate pads, the layer of graphene configured to convey thermal energy away from the semiconductor die, wherein the layer of graphene is in contact with the semiconductor die.

16. The semiconductor device package of claim 15, wherein the semiconductor die comprises one or more memory dies, controller dies, processor dies, or some combination thereof.

17. The semiconductor device package of claim 15, further comprising a thermal structure in contact with the layer of graphene and configured to export heat from the semiconductor device package.

18. The semiconductor device package of claim 15, wherein the layer of graphene is electrically insulated from the plurality of electrical contacts and the plurality of substrate pads.

19. The semiconductor device package of claim 15, wherein the layer of graphene comprises a plurality of monolayers of graphene.

\* \* \* \* \*